(12) United States Patent
Zhang et al.

(10) Patent No.: US 10,139,441 B2
(45) Date of Patent: Nov. 27, 2018

(54) FILM STRUCTURE AND ITS MEASURING METHOD, DISPLAY SUBSTRATE AND ITS MEASURING METHOD AND MANUFACTURING METHOD

(71) Applicant: BOE Technology Group Co., Ltd., Beijing (CN)

(72) Inventors: Yujun Zhang, Beijing (CN); Chao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 259 days.

(21) Appl. No.: 15/105,594

(22) PCT Filed: Sep. 18, 2015

(86) PCT No.: PCT/CN2015/089944
§ 371 (c)(1),
(2) Date: Jun. 17, 2016

(87) PCT Pub. No.: WO2016/173184
PCT Pub. Date: Nov. 3, 2016

(65) Prior Publication Data
US 2017/0122992 A1    May 4, 2017

(30) Foreign Application Priority Data
Apr. 29, 2015   (CN) .......................... 2015 1 0214085

(51) Int. Cl.
*G01R 27/26* (2006.01)
*G01D 5/24* (2006.01)
*G02F 1/13* (2006.01)

(52) U.S. Cl.
CPC ....... *G01R 27/2617* (2013.01); *G01D 5/2405* (2013.01); *G01R 27/2605* (2013.01); *G01D 5/24* (2013.01); *G02F 1/1309* (2013.01)

(58) Field of Classification Search
CPC ........ G01R 27/00; G01R 27/02; G01R 27/26; G01R 27/2605; G01R 27/2617;
(Continued)

(56) References Cited

U.S. PATENT DOCUMENTS 5,939,746 A * 8/1999 Koyama ........... H01L 27/10852
257/306
6,348,408 B1 * 2/2002 Kasai ................ H01L 21/76807
257/E21.579
(Continued)

FOREIGN PATENT DOCUMENTS

CN          1841733 A     10/2006
CN        101329158 A     12/2008
(Continued)

OTHER PUBLICATIONS

Second Office Action for Chinese Patent Application No. 201510214085.8, dated May 10, 2017, 25 pages.
(Continued)

*Primary Examiner* — Hoai-An D. Nguyen
(74) *Attorney, Agent, or Firm* — Westman, Champlin & Koehler, P.A.

(57) ABSTRACT

A film structure includes a first metal layer, a second metal layer, and an insulation layer located between the first metal layer and the second metal layer. In at least a portion of an edge region of the film structure, the first metal layer extends outwards relative to an edge of the insulation layer by a first predetermined length, and the insulation layer extends outwards relative to an edge of the second metal layer by a second predetermined length. In this way, when the film structure is measured, a fall value between the surface, adjacent to the second metal layer, of the insulation layer and the surface, adjacent to the insulation layer, of the first metal layer is measured by means of a motion trajectory of the measuring probe at the time of ascending or descending,
(Continued)

thereby obtaining a more accurate thickness value of the insulation layer.

20 Claims, 3 Drawing Sheets

(58) Field of Classification Search
CPC ........ G01D 5/24; G01D 5/2405; G01D 5/241; G01D 5/2412; G01D 5/2417
USPC ....... 324/600, 649, 658, 661, 662, 663, 671, 324/686, 548; 702/47, 52
See application file for complete search history.

(56) References Cited

U.S. PATENT DOCUMENTS

| | | |
|---|---|---|
| 6,504,386 B1 | 1/2003 | Bhushan et al. |
| 7,109,090 B1 | 9/2006 | Huang et al. |
| 9,035,665 B2 | 5/2015 | Riedel |
| 9,054,334 B2 | 6/2015 | Nakamura et al. |
| 9,299,859 B2 * | 3/2016 | Chen .................. H01L 23/5223 |
| 2007/0148960 A1 * | 6/2007 | Park .................. H01L 21/76849 438/622 |
| 2010/0220377 A1 * | 9/2010 | Yamada .................. G02B 5/008 359/241 |
| 2013/0277650 A1 | 10/2013 | Yoneya et al. |

FOREIGN PATENT DOCUMENTS

| | | |
|---|---|---|
| CN | 102420209 A | 4/2012 |
| CN | 102650661 A | 8/2012 |
| CN | 103026169 A | 4/2013 |
| CN | 103053221 A | 4/2013 |
| CN | 103278124 A | 9/2013 |
| CN | 103994740 A | 8/2014 |
| CN | 103994741 A | 8/2014 |
| CN | 104061853 A | 9/2014 |
| CN | 104808072 A | 7/2015 |

OTHER PUBLICATIONS

Rejection Decision for Chinese Patent Application No. 201510214085.8, dated Sep. 8, 2017, 25 pages.

International Search Report and Written Opinion for International Application No. PCT/CN2015/089944, dated Jan. 5, 2016, 10 pages.

English translation of Box No. V of the Written Opinion of the International Searching Authority for International Application No. PCT/CN2015/089944, dated Jan. 5, 2016, 2 pages.

First Office Action, including Search Report, for Chinese Patent Application No. 201510214085.8, dated Mar. 21, 2017, 27 pages.

* cited by examiner

FILM STRUCTURE AND ITS MEASURING METHOD, DISPLAY SUBSTRATE AND ITS MEASURING METHOD AND MANUFACTURING METHOD

CROSS-REFERENCE TO RELATED APPLICATIONS

This application is a Section 371 National Stage Application of International Application No. PCT/CN2015/089944, filed on 18 Sep. 2015, entitled "FILM STRUCTURE AND ITS MEASURING METHOD, DISPLAY SUBSTRATE AND ITS MEASURING METHOD AND MANUFACTURING METHOD", which has not yet published, which claims priority to Chinese Application No. 201510214085.8, filed on 29 Apr. 2015, incorporated herein by reference in their entirety.

BACKGROUND

1. Technical Field

Embodiments of the present invention relate to the field of display, and particularly to a film structure and its measuring method, a display substrate and its measuring method and manufacturing method.

2. Description of the Related Art

Measurement of a dielectric constant of a film to be measured, generally, is necessary to be performed on a display substrate for achieving a displaying function. A conventional measurement of dielectric constant is performed as follows. First, a capacitance value of a film structure to be measured is measured, and then a dielectric constant $\varepsilon$ of the film to be measured is found by calculating according to a formula: $C=\varepsilon*A/D$, where A is an area of overlap of upper and lower electrodes (i.e., two metal layers disposed opposite to each other) of the film structure to be measured, and D is a distance between the upper and lower electrodes (i.e., a thickness of an insulation film). Generally, the thickness value D is estimated according to measurements of films formed by chemical vapor deposition, or is obtained by being measured with a scanning electron microscope after slicing. However, an accuracy of the thickness values of the film obtained by the measurements is adversely affected to a certain degree because it is limited to the fact that it cannot be ensured that a slice is completely perpendicular to the film when preparing a sample, and that the slice to be measured is also probably an inclined plane during measurement of the sample. Therefore, neither the thickness values estimated according to measurements of the films formed by the chemical vapor deposition, nor the thickness values obtained by measurement with the scanning electron microscope are accurate enough. As a result, a value of the dielectric constant of the film which is finally found is not accurate.

SUMMARY

Embodiments of the present invention provide a film structure comprising: a first metal layer, a second metal layer, and an insulation layer located between the first metal layer and the second metal layer, wherein: in at least a portion of an edge region of the film structure, the first metal layer extends outwards relative to an edge of the insulation layer by a first predetermined length, and the insulation layer extends outwards relative to an edge of the second metal layer by a second predetermined length.

Embodiments of the present invention also provide a measuring method for the abovementioned film structure. The measuring method is configured to measure a dielectric constant of the insulation layer. The measuring method comprises: determining a thickness value of the insulation layer by acquiring a fall value of a measuring probe at the time of moving between a surface, adjacent to the second metal layer, of the insulation layer and a surface, adjacent to the insulation layer, of the first metal layer, through a motion trajectory of the measuring probe in at least the portion of the edge region of the film structure, thereby calculating the dielectric constant of the insulation layer.

Embodiments of the present invention further provide a display substrate comprising: a display region and a peripheral region. The peripheral region of the display substrate has at least one measurement region. In the measurement region, the display substrate comprises: a first metal layer, a second metal layer and an insulation layer located between the first metal layer and the second metal layer, wherein: in at least a portion of an edge region of the first metal layer, the second metal layer and the insulation layer, the first metal layer extends outwards relative to an edge of the insulation layer by a first predetermined length, and the insulation layer extends outwards relative to an edge of the second metal layer by a second predetermined length.

Embodiments of the present invention also provide a measuring method for the abovementioned display substrate. The measuring method is configured to measure a dielectric constant of the insulation layer. The measuring method comprises: determining a thickness value of the insulation layer by acquiring a fall value of a measuring probe at the time of moving between a surface, adjacent to the second metal layer, of the insulation layer and a surface, adjacent to the insulation layer, of the first metal layer, through a motion trajectory of the measuring probe in at least the portion of the edge region of the first metal layer, the insulation layer, and the second metal layer, thereby calculating the dielectric constant of the insulation layer.

Embodiments of the present invention provide a manufacturing method for the abovementioned display substrate, the manufacturing method comprising:

forming patterns of the first metal layer and the first measuring terminal on a substrate by a single patterning process;

forming a pattern of the insulation layer on the substrate formed with the first metal layer; and forming patterns of the second metal layer and the second measuring terminal on the substrate formed with the insulation layer, by a single patterning process.

DETAILED DESCRIPTION OF THE EMBODIMENTS

Specific embodiments of a film structure and its measuring method, a display substrate and its measuring method and manufacturing method will be described in detail as below with reference to the accompanying drawings.

Figure 1:
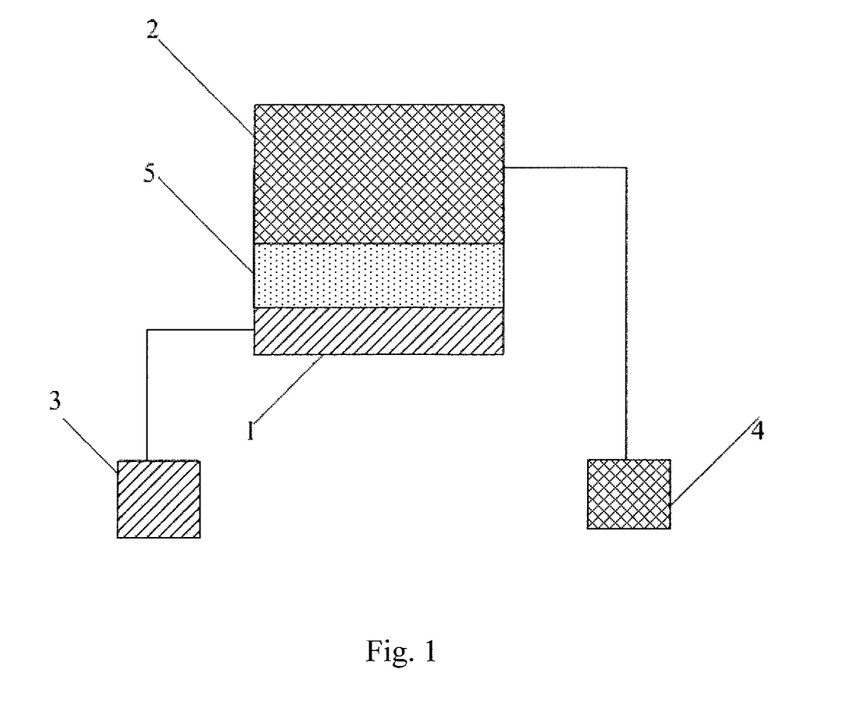
FIG. 1 is a schematic diagram showing configuration of a film structure according to an embodiment of the present invention.
Figure 2:
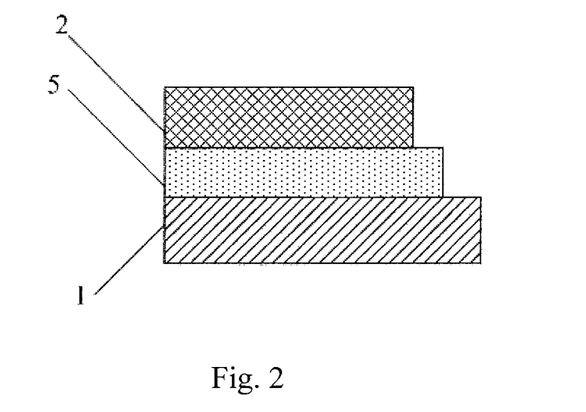
FIG. 2 is another schematic diagram showing configuration of the film structure according to the embodiment of the present invention.

Embodiments of the present invention provide a film structure. As shown in FIGS. 1 and 2, the film structure comprises: a first metal layer 1, a second metal layer 2, a first measuring terminal 3, a second measuring terminal 4, and an insulation layer 5 located between the first metal layer 1 and the second metal layer 2.

The first measuring terminal 3 is connected with the first metal layer 1, and the second measuring terminal 4 is connected with the second metal layer 2.

In at least a portion of an edge region of the film structure, the first metal layer 1 extends outwards relative to an edge of the insulation layer 5 by a first predetermined length, and the insulation layer 5 extends outwards relative to an edge of the second metal layer 2 by a second predetermined length. For example, in at least the portion of the edge region of the film structure, the first metal layer 1, the insulation layer 5 and the second metal layer 2 are formed in the step structure, or three layers including the first metal layer 1, the insulation layer 5 and the second metal layer 2 are formed in a step structure on at least one side. In the step structure, an area of a surface, adjacent to the insulation layer 5, of the first metal layer 1 may be greater than or equal to an area of a surface, adjacent to the second metal layer 2, of the insulation layer 5. The first predetermined length may be greater than or equal to the second predetermined length. As shown in FIG. 1, the film structure according to the embodiment of the present invention comprises: the first metal layer 1, the second metal layer 2, the first measuring terminal 3, the second measuring terminal 4, and the insulation layer 5 located between the first metal layer 1 and the second metal layer 2. The first measuring terminal 3 is connected with the first metal layer 1, and the second measuring terminal 4 is connected with the second metal layer 2. As shown in FIG. 2, three layers including the first metal layer 1, the insulation layer 5 and the second metal layer 2 are formed in a step structure on at least one side. In this way, when the abovementioned film structure is measured, a more accurate thickness of the insulation layer is acquired by measuring the fall of the step structure through the motion trajectory of the measuring probe at the time of ascending or descending. Compared with estimating of a thickness of a film to be measured according to a measurement of the film formed by chemical vapor deposition, or obtaining of a thickness value of a film to be measured by a scanning electron microscope, a more accurate thickness of the insulation layer can be acquired by measuring the fall of the step structure through the motion trajectory of the measuring probe at the time of ascending or descending, according to the embodiments of the present invention. Then, a more accurate dielectric constant of the insulation layer can be calculated according to a capacitance between the first metal layer and the second metal layer and an area of overlap of the first metal layer and the second metal layer.

Figure 3:
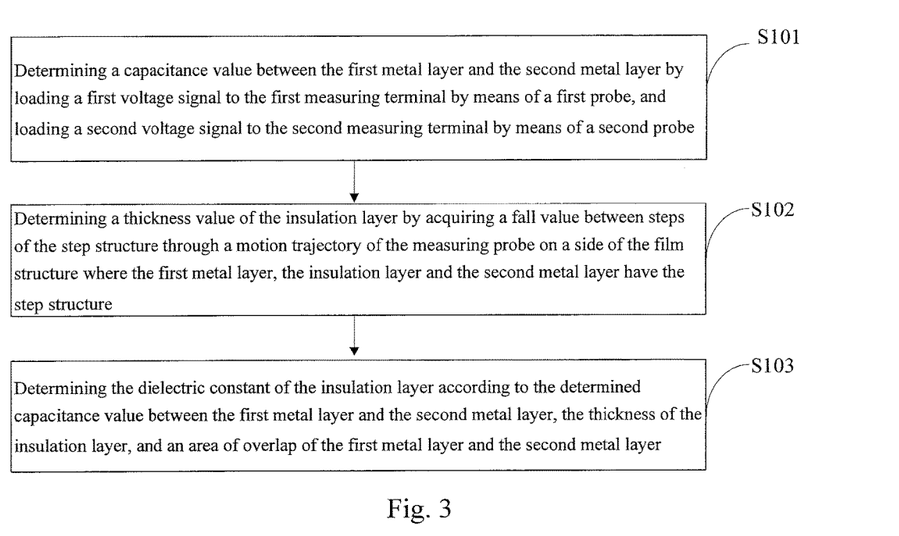
FIG. 3 is a flow diagram showing a measuring method of the film structure according to an embodiment of the present invention.

Based on the same inventive concept, embodiments of the present invention provide a measuring method for the abovementioned film structure. The measuring method is configured to measure a dielectric constant of the insulation layer. As shown in FIG. 3, the measuring method may comprise:

a step S101 of determining a capacitance value between the first metal layer and the second metal layer by loading a first voltage signal to the first measuring terminal by means of a first probe, and loading a second voltage signal to the second measuring terminal by means of a second probe;

a step S102 of determining a thickness value of the insulation layer by acquiring a fall value between steps of the step structure through a motion trajectory of the measuring probe on a side of the film structure where the first metal layer, the insulation layer and the second metal layer have the step structure; and a step S103 of determining the dielectric constant of the insulation layer according to the determined capacitance value between the first metal layer and the second metal layer, the thickness of the insulation layer, and the area of overlap of the first metal layer and the second metal layer.

In embodiments of the present invention, the measuring method for the film structure comprises: determining a thickness value of the insulation layer by acquiring a fall value of a measuring probe at the time of moving between a surface, adjacent to the second metal layer, of the insulation layer and a surface, adjacent to the insulation layer, of the first metal layer, through a motion trajectory of the measuring probe in at least the portion of the edge region of the film structure, thereby calculating the dielectric constant of the insulation layer. For example, the first metal layer, the insulation layer, and the second metal layer of the film structure are formed in the step structure, in at least the portion of the edge region of the film structure.

In embodiments of the present invention, the film structure may further comprise: a first measuring terminal connected with the first metal layer, and a second measuring terminal connected with the second metal layer, and the measuring method may further comprise: determining a capacitance value between the first metal layer and the second metal layer by loading a first voltage signal to the first measuring terminal by means of a first probe, and loading a second voltage signal to the second measuring terminal by means of a second probe; and determining the dielectric constant of the insulation layer according to the determined capacitance value between the first metal layer and the second metal layer, the thickness of the insulation layer, and the area of overlap of the first metal layer and the second metal layer.

In embodiments of the present invention, the first metal layer, the insulation layer and the second metal layer of the film structure are formed in a step structure on at least one side, and the measuring method comprises: determining the thickness value of the insulation layer by acquiring the fall value of the measuring probe at the time of moving between the surface, adjacent to the second metal layer, of the insulation layer and the surface, adjacent to the insulation layer, of the first metal layer, through the motion trajectory of the measuring probe on a side of the film structure where the first metal layer, the insulation layer and the second metal layer have the step structure.

In the measuring method for the abovementioned film structure according to the embodiments of the present invention, voltage signals may be loaded to the first measuring terminal and the second measuring terminal by means of a first probe and a second probe, respectively, thereby determining a capacitance value between the first metal layer and the second metal layer, and a more accurate thickness of the insulation layer is acquired by measuring the fall of the step structure through the motion trajectory of the measuring probe at the time of ascending or descending. Compared with estimating of a thickness of a film to be measured according to a measurement of the film formed by chemical vapor deposition, or obtaining of a thickness value of a film to be measured by a scanning electron microscope, a more accurate thickness of the insulation layer can be acquired by measuring the fall of the step structure through the motion trajectory of the measuring probe at the time of ascending or descending, according to the embodiments of the present invention. Then, a more accurate dielectric constant of the insulation layer can be calculated according to a capacitance between the first metal layer and the second metal layer and an area of overlap of the first metal layer and the second metal layer.

Based on the same inventive concept, embodiments of the present invention provide a display substrate comprising a display region and a peripheral region. The peripheral region of the display substrate has at least one measurement region. In the measurement region, the display substrate comprises: a first metal layer, a second metal layer, a first measuring terminal, a second measuring terminal, and an insulation layer located between the first metal layer and the second metal layer, wherein:

the first measuring terminal is connected with the first metal layer, and the second measuring terminal is connected with the second metal layer;

three layers including the first metal layer, the insulation layer and the second metal layer are formed in a step structure on at least one side; and the first metal layer and the second metal layer correspond to two metal layers located in different layers in the display region, respectively, and are located in same layers as the two corresponding metal layers, respectively, and the insulation layer is located in a same layer as an insulation layer between the two metal layers.

Figure 5:
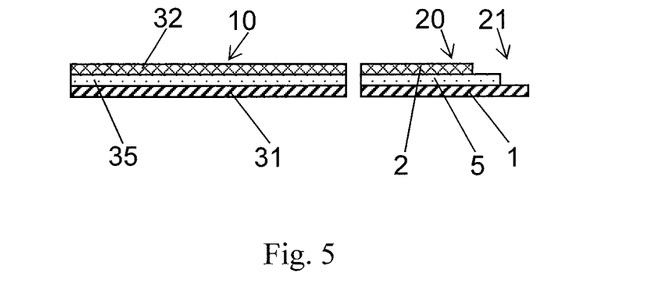
FIG. 5 is a schematic diagram showing configuration of a display substrate according to an embodiment of the present invention.
Figure 6:
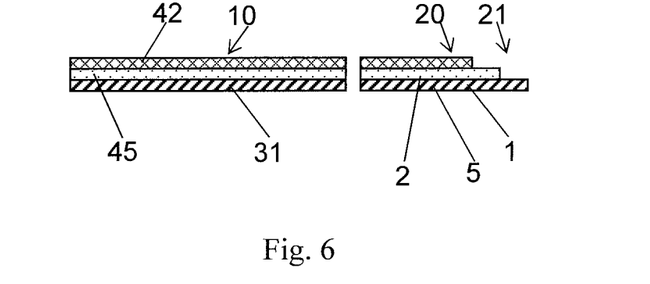
FIG. 6 is another schematic diagram showing the configuration of the display substrate according to the embodiment of the present invention.

According to some embodiments of the present invention, referring to FIGS. 5 and 6, the display substrate comprises a display region 10 and a peripheral region 20. The peripheral region 20 of the display substrate has at least one measurement region 21. In the measurement region, the display substrate comprises: a first metal layer, a second metal layer, and an insulation layer located between the first metal layer and the second metal layer, wherein: in at least a portion of an edge region of the first metal layer, the second metal layer and the insulation layer, the first metal layer extends outwards relative to an edge of the insulation layer by a first predetermined length, and the insulation layer extends outwards relative to an edge of the second metal layer by a second predetermined length. For example, the first metal layer, the insulation layer, and the second metal layer are formed in the step structure in at least the portion of the edge region of the first metal layer, the insulation layer and the second metal layer, or the first metal layer, the insulation layer and the second metal layer are formed in a step structure on at least one side. According to embodiments of the present invention, the first metal layer and the second metal layer correspond to two metal layers located in different layers in the display region, respectively, and are located in same layers as the two corresponding metal layers, respectively, and the insulation layer is located in a same layer as an insulation layer between the two metal layers.

In some embodiments of the present invention, in the measurement region, the display substrate further comprises: a first measuring terminal connected with the first metal layer, and a second measuring terminal connected with the second metal layer.

In the display substrate according to the embodiment of the present invention, the display substrate comprises a display region and a peripheral region. The peripheral region of the display substrate has at least one measurement region. In the measurement region, the display substrate comprises: a first metal layer, a second metal layer, a first measuring terminal, a second measuring terminal, and an insulation layer located between the first metal layer and the second metal layer, wherein: the first measuring terminal is connected with the first metal layer, and the second measuring terminal is connected with the second metal layer; three layers including the first metal layer, the insulation layer and the second metal layer are formed in a step structure on at least one side, and the first metal layer and the second metal layer correspond to two metal layers located in different layers in the display region, respectively, and are located in same layers as the two corresponding metal layers, respectively, and the insulation layer is located in a same layer as an insulation layer between the two metal layers. In this way, when the measurement region of the peripheral region of the display substrate is measured, a more accurate thickness of the insulation layer is acquired by measuring the fall of the step structure through the motion trajectory of the measuring probe at the time of ascending or descending. Compared with estimating of a thickness of a film to be measured according to a measurement of the film formed by chemical vapor deposition, or obtaining of a thickness value of a film to be measured by a scanning electron microscope, a more accurate thickness of the insulation layer can be acquired by measuring the fall of the step structure through the motion trajectory of the measuring probe at the time of ascending or descending, according to the embodiments of the present invention. Then, a more accurate dielectric constant of the insulation layer can be calculated according to a capacitance between the first metal layer and the second metal layer and an area of overlap of the first metal layer and the second metal layer. Meanwhile, a dielectric constant of the corresponding film in the display region can be determined according to the dielectric constant of the film to be measured which is acquired by measuring the measurement region.

In a specific implementation, in the display substrate according to the embodiment of the present invention, in the step structure, an area of a step of the first metal layer or the second metal layer located below the insulation layer is greater than or equal to an area of a step of the insulation layer; in the step structure, an area of a surface, adjacent to the insulation layer, of the first metal layer is greater than or equal to an area of a surface, adjacent to the second metal layer, of the insulation layer; or the first predetermined length is greater than or equal to the second predetermined length. Specifically, in the display substrate according to the embodiment of the present invention, three layers including the first metal layer, the insulation layer and the second metal layer are formed with a step structure on a side. In the step structure, an area of a step of the first metal layer or the second metal layer located below the insulation layer may be greater than or equal to an area of a step of the insulation layer. During a measurement, a level difference measuring device may be used to measure the fall for the step structure. In other words, after a measuring probe of the level difference measuring device moves vertically downwards to reach a surface of the second metal layer or the first metal layer, it begins to move horizontally. When an area where a fall occurs is measured, the measuring probe will automatically descend or ascend by a vertical distance accordingly. A motion trajectory of the measuring probe is calculated by a control computer. The motion trajectory has two interfaces between which a fall exists. Finally, a thickness value of the insulation layer to be measured is obtained.

In a specific implementation, in the display substrate according to the embodiment of the present invention, the first measuring terminal may be located in a same layer as the first metal layer, and the second measuring terminal may be located in a same layer as the second metal layer. In this way, in a process for manufacturing the display substrate, the first metal layer and the first measuring terminal may be formed by a single patterning process, and the second metal layer and the second measuring terminal may be formed by a single patterning process, thereby facilitating simplification of a manufacturing process of the display substrate and reduction of production cost. In addition, the first metal layer is connected with the first measuring terminal, and the second metal layer is connected with the second measuring terminal. When a capacitance is measured, a capacitance formed between the first metal layer and the second metal layer can be measured by loading voltage signals to the first measuring terminal and the second measuring terminal.

In a specific implementation, in the display substrate according to the embodiment of the present invention, referring to FIGS. 5 and 6, in the display region 10 of the display substrate, the display substrate comprises: a common electrode layer 31, a pixel electrode layer 32, and a source and drain electrode layer 42, the first metal layer 1 is located in a same layer as the common electrode layer 31, and the second metal layer 2 is located in a same layer as the pixel electrode layer 32 or the source and drain electrode layer 42. Specifically, in a manufacturing process of the display substrate according to the embodiment of the present invention, when films in the display region are manufactured, measuring films in the peripheral region may also be manufactured simultaneously. For example, in the manufacturing process of the display substrate, the common electrode layer 31 in the display region 10 and the first metal layer 1 in the measurement region 20 may be formed by a single patterning process, the pixel electrode layer 32 or the source and drain electrode layer 42 in the display region 10 and the second metal layer 2 in the measurement region 20 may be formed by a single patterning process, and accordingly the insulation layer 5 in the measurement region 20 and an insulation layer 35 between the common electrode layer 31 and the pixel electrode layer 32 or an insulation layer 45 between the common electrode layer 31 and the source and drain electrode layer 42 in the display region 10 may be formed by a same patterning process. In this way, when a dielectric constant measurement on the measurement region is performed, a dielectric constant of a film corresponding to that in the measurement region, in the display region can be measured accordingly.

Based on the same inventive concept, embodiments of the present invention provide a measuring method for the abovementioned display substrate. The measuring method is configured to measure a dielectric constant of the insulation layer. The measuring method may comprise the steps of:

determining a capacitance value between the first metal layer and the second metal layer by loading a first voltage signal to the first measuring terminal by means of a first probe, and loading a second voltage signal to the second measuring terminal by means of a second probe;

determining a thickness value of the insulation layer by acquiring a fall value between steps of the step structure through a motion trajectory of the measuring probe on a side of the display substrate where the first metal layer, the insulation layer, and the second metal layer have the step structure; and determining the dielectric constant of the insulation layer according to the determined capacitance value between the first metal layer and the second metal layer, the thickness of the insulation layer, and the area of overlap of the first metal layer and the second metal layer.

Specifically, in the measuring method for the abovementioned display substrate according to the embodiment of the present invention, voltage signals are loaded to the first measuring terminal and the second measuring terminal by means of the first probe and the second probe, respectively, thereby determining a capacitance value between the first metal layer and the second metal layer; a fall measurement on the step structure formed by the first metal layer, the insulation layer and the second metal layer is performed by means of a measuring probe of a level difference measuring device, so that a fall value of the step structure is acquired through a motion trajectory of the measuring probe at the time of ascending or descending, thereby obtaining a thickness value of the insulation layer; and then according to the capacitance value between the first metal layer and the second metal layer and an area of overlap of the first metal layer and the second metal layer, a dielectric constant of the insulation layer is determined by means of a calculation formula: $C=\varepsilon*A/D$, where C is the capacitance value between the first metal layer and the second metal layer, A is the area of overlap of the first metal layer and the second metal layer, D is the thickness of the insulation film, and E is the dielectric constant of the insulation layer.

In a specific implementation, in the measuring method for the abovementioned display substrate according to the embodiment of the present invention, the process for determining the thickness of the insulation layer may specifically comprise: measuring, by the measuring probe, the fall between the steps of the step structure on a side of the display substrate where the first metal layer, the insulation layer, and the second metal layer have the step structure, and recording a motion trajectory of the measuring probe at the time of ascending or descending; acquiring the fall value between the steps of the step structure according to the recorded motion trajectory of the measuring probe at the time of ascending or descending; and determining the thickness value of the insulation layer according to the acquired fall value between the steps of the step structure. Specifically, in the measuring method for the abovementioned display substrate according to the embodiment of the present invention, a fall measurement on a step structure formed by three layers including the first metal layer, the insulation layer and the second metal layer on a side is performed by means of a level difference measuring device.

In other words, when a measurement is performed, a measuring probe of the level difference measuring device moves vertically downwards to reach a surface of the second metal layer or the first metal layer, and then it begins to move horizontally. When an area where a fall occurs is measured, the measuring probe will automatically descend or ascend by a vertical distance accordingly. A motion trajectory of the measuring probe at the time of ascending or descending is calculated by a control computer. The motion trajectory has two interfaces between which a fall exists. Thereby, the fall value between the steps of the step structure is obtained. Finally, a thickness value of the insulation layer to be measured is obtained.

According to some embodiments of the present invention, the measuring method of the display substrate comprises: determining a thickness value of the insulation layer by acquiring a fall value of a measuring probe at the time of moving between a surface, adjacent to the second metal layer, of the insulation layer and a surface, adjacent to the insulation layer, of the first metal layer, through a motion trajectory of the measuring probe in at least the portion of the edge region of the first metal layer, the insulation layer and the second metal layer, thereby calculating the dielectric constant of the insulation layer. For example, the first metal layer, the insulation layer and the second metal layer are formed in the step structure, in at least the portion of the edge region of the first metal layer, the insulation layer and the second metal layer.

According to some embodiments of the present invention, in the measurement region, the display substrate further comprises: a first measuring terminal connected with the first metal layer, and a second measuring terminal connected with the second metal layer, and the measuring method further comprises: determining a capacitance value between the first metal layer and the second metal layer by loading a first voltage signal to the first measuring terminal by means of a first probe, and loading a second voltage signal to the second measuring terminal by means of a second probe; and determining the dielectric constant of the insulation layer according to the determined capacitance value between the first metal layer and the second metal layer, the thickness of the insulation layer, and the area of overlap of the first metal layer and the second metal layer.

According to embodiments of the present invention, the determining the thickness value of the insulation layer specifically comprises: measuring, by a measuring probe, a fall of the measuring probe at the time of moving between the surface, adjacent to the second metal layer, of the insulation layer and the surface, adjacent to the insulation layer, of the first metal layer, and recording a motion trajectory of the measuring probe at the time of ascending or descending; acquiring a fall value between the surface, adjacent to the second metal layer, of the insulation layer and the surface, adjacent to the insulation layer, of the first metal layer according to the recorded motion trajectory of the measuring probe at the time of ascending or descending; and determining the thickness value of the insulation layer according to the acquired fall value.

Figure 4:
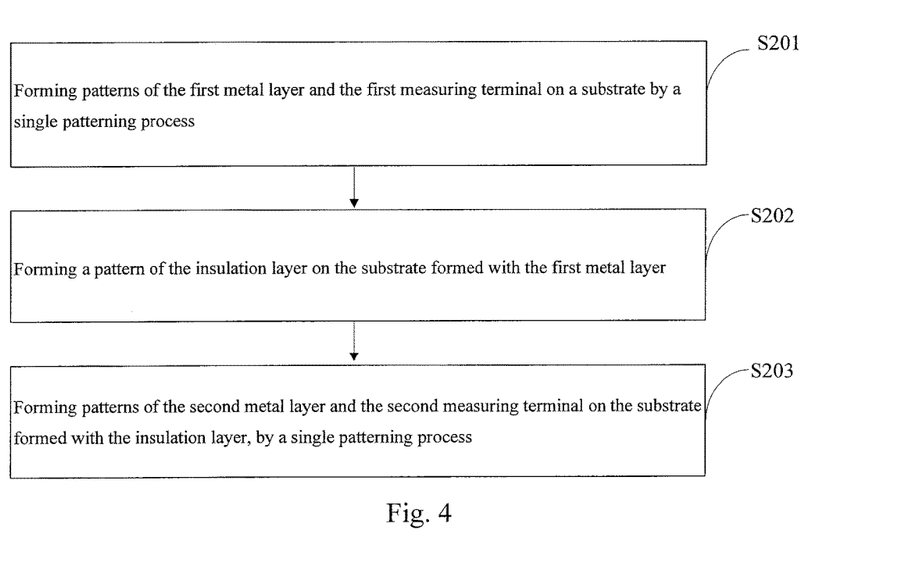
FIG. 4 is a flow diagram showing a manufacturing method of a display substrate according to an embodiment of the present invention.

Based on the same inventive concept, embodiments of the present invention provide a method of manufacturing the abovementioned display substrate. As shown in FIG. 4, the method may comprise:

a step S201 of forming patterns of the first metal layer and the first measuring terminal on a substrate by a single patterning process;

a step S202 of forming a pattern of the insulation layer on the substrate formed with the first metal layer; and a step S203 of forming patterns of the second metal layer and the second measuring terminal on the substrate formed with the insulation layer, by a single patterning process.

Specifically, in the method of manufacturing the abovementioned display substrate according to an embodiment of the present invention, the patterns of the first metal layer and the first measuring terminal may be formed by a single patterning process. In other words, the first metal layer and the first measuring terminal are simultaneously formed by exposing, developing, and etching in a peripheral region of the display substrate; the insulation layer is formed on the formed first metal layer by a single patterning process by exposing, developing, and etching; and the patterns of the second metal layer and the second measuring terminal are formed on the substrate formed with the insulation layer by a single patterning process by exposing, developing, and etching. In this way, a manufacturing process of the display substrate can be simplified and production cost is reduced.

In a specific implementation, in the method of manufacturing the abovementioned display substrate according to an embodiment of the present invention, the pattern of the first metal layer and a pattern of the common electrode layer may be formed by a single patterning process, and the pattern of the second metal layer and a pattern of the pixel electrode layer or the source and drain electrode layer may be formed by a single patterning process. Specifically, in the method of manufacturing the abovementioned display substrate according to an embodiment of the present invention, the first metal layer may be located in a same layer as the common electrode layer. In the manufacturing process of the display substrate, the common electrode layer in the display region and the first metal layer in the measurement region are respectively formed by a single patterning process by exposing, developing, and etching in the display region and the peripheral region; the insulation layer in the measurement region and a pattern of a corresponding insulation layer in the display region are synchronously accomplished by a single patterning process by exposing, developing, and etching; and the second metal layer in the measurement region and the source and drain electrode layer or the pixel electrode layer in the display region are synchronously accomplished by a single patterning process by exposing, developing, and etching. In this way, when a dielectric constant measurement on the measurement region is performed, a dielectric constant of a corresponding film in the display region can be measured accordingly, while the corresponding films in the display region and the measurement region are formed by the same patterning processes, respectively. Thereby the manufacturing process of the display substrate can be simplified and production cost is reduced.

Embodiments of the present invention provide a film structure and its measuring method, a display substrate and its measuring method and manufacturing method. The film structure comprises: a first metal layer, a second metal layer, a first measuring terminal, a second measuring terminal, and an insulation layer located between the first metal layer and the second metal layer, wherein: the first measuring terminal is connected with the first metal layer, and the second measuring terminal is connected with the second metal layer; and three layers including the first metal layer, the insulation layer and the second metal layer are formed in a step structure on at least one side. In this way, when the abovementioned film structure is measured, a more accurate thickness of the insulation layer is acquired by measuring the fall of the step structure through the motion trajectory of the measuring probe at the time of ascending or descending. Compared with estimating of a thickness of a film to be measured according to a measurement of the film formed by chemical vapor deposition, or obtaining of a thickness value of a film to be measured by a scanning electron microscope, a more accurate thickness of the insulation layer can be acquired by measuring the fall of the step structure through the motion trajectory of the measuring probe at the time of ascending or descending, according to the embodiments of the present invention. Then, a more accurate dielectric constant of the insulation layer can be calculated according to a capacitance between the first metal layer and the second metal layer and an area of overlap of the first metal layer and the second metal layer.

Embodiments of the present invention provide a film structure comprising: a first metal layer, a second metal layer, a first measuring terminal, a second measuring terminal, and an insulation layer located between the first metal layer and the second metal layer, wherein:

the first measuring terminal is connected with the first metal layer, and the second measuring terminal is connected with the second metal layer; and three layers including the first metal layer, the insulation layer and the second metal layer are formed in a step structure on at least one side.

Embodiments of the present invention provide a measuring method for the abovementioned film structure. The measuring method is configured to measure a dielectric constant of the insulation layer. The measuring method comprises:

determining a capacitance value between the first metal layer and the second metal layer by loading a first voltage signal to the first measuring terminal by means of a first probe, and loading a second voltage signal to the second measuring terminal by means of a second probe;

determining a thickness value of the insulation layer by acquiring a fall value between steps of the step structure through a motion trajectory of the measuring probe on a side of the film structure where the first metal layer, the insulation layer, and the second metal layer have the step structure; and determining the dielectric constant of the insulation layer according to the determined capacitance value between the first metal layer and the second metal layer, the thickness of the insulation layer, and the area of overlap of the first metal layer and the second metal layer.

Embodiments of the present invention provide a display substrate comprising a display region and a peripheral region. The peripheral region of the display substrate has at least one measurement region. In the measurement region, the display substrate comprises: a first metal layer, a second metal layer, a first measuring terminal, a second measuring terminal, and an insulation layer located between the first metal layer and the second metal layer, wherein:

the first measuring terminal is connected with the first metal layer, and the second measuring terminal is connected with the second metal layer; and three layers including the first metal layer, the insulation layer, and the second metal layer are formed in a step structure on at least one side; and the first metal layer and the second metal layer correspond to two metal layers located in different layers in the display region, respectively, and are located in same layers as the two corresponding metal layers, respectively, and the insulation layer is located in a same layer as an insulation layer between the two metal layers located in different layers.

In a possible implementation, in the display substrate according to an embodiment of the present invention, in the step structure, an area of a step of the first metal layer or the second metal layer located below the insulation layer is greater than or equal to an area of a step of the insulation layer.

In a possible implementation, in the display substrate according to an embodiment of the present invention, the first measuring terminal is located in a same layer as the first metal layer, and the second measuring terminal is located in a same layer as the second metal layer.

In a possible implementation, in the display substrate according to an embodiment of the present invention, in the display region of the display substrate, the display substrate comprises: a common electrode layer, a pixel electrode layer, and a source and drain electrode layer, the first metal layer is located in a same layer as the common electrode layer, and the second metal layer is located in a same layer as the pixel electrode layer or the source and drain electrode layer.

Embodiments of the present invention provide a measuring method for the abovementioned display substrate. The measuring method is configured to measure a dielectric constant of the insulation layer. The measuring method comprises:

determining a capacitance value between the first metal layer and the second metal layer by loading a first voltage signal to the first measuring terminal by means of a first probe, and loading a second voltage signal to the second measuring terminal by means of a second probe;

determining a thickness value of the insulation layer by acquiring a fall value between steps of the step structure through a motion trajectory of the measuring probe on a side of the display substrate where the first metal layer, the insulation layer and the second metal layer have the step structure; and determining the dielectric constant of the insulation layer according to the determined capacitance value between the first metal layer and the second metal layer, the thickness of the insulation layer, and the area of overlap of the first metal layer and the second metal layer.

In a possible implementation, in the measuring method for the abovementioned display substrate according to the embodiment of the present invention, the determining the thickness value of the insulation layer by acquiring the fall value of the step structure through the motion trajectory of the measuring probe on the side of the display substrate where the first metal layer, the insulation layer and the second metal layer have the step structure, specifically comprises:

measuring, by the measuring probe, the fall between the steps of the step structure on the side of the display substrate where the first metal layer, the insulation layer, and the second metal layer have the step structure, and recording a motion trajectory of the measuring probe at the time of ascending or descending;

acquiring the fall value between the steps of the step structure according to the recorded motion trajectory of the measuring probe at the time of ascending or descending; and determining the thickness value of the insulation layer according to the acquired fall value between the steps of the step structure.

Embodiments of the present invention provide a manufacturing method for the abovementioned display substrate, the manufacturing method comprising:

forming patterns of the first metal layer and the first measuring terminal on a substrate by a single patterning process;

forming a pattern of the insulation layer on the substrate formed with the first metal layer; and forming patterns of the second metal layer and the second measuring terminal on the substrate formed with the insulation layer, by a single patterning process.

In a possible implementation, in the manufacturing method for the abovementioned display substrate according to an embodiment of the present invention, the pattern of the first metal layer and a pattern of the common electrode layer are formed by a single patterning process, and the pattern of the second metal layer and a pattern of the pixel electrode layer or the source and drain electrode layer are formed by a single patterning process.

Embodiments of the present invention provide a film structure and its measuring method, a display substrate and its measuring method and manufacturing method. The film structure comprises: a first metal layer, a second metal layer, a first measuring terminal, a second measuring terminal, and an insulation layer located between the first metal layer and the second metal layer, wherein: the first measuring terminal is connected with the first metal layer, and the second measuring terminal is connected with the second metal layer; and three layers including the first metal layer, the insulation layer, and the second metal layer are formed in a step structure on at least one side. In this way, when the abovementioned film structure is measured, a more accurate thickness of the insulation layer is acquired by measuring the fall of the step structure through the motion trajectory of the measuring probe at the time of ascending or descending. Compared with estimating of a thickness of a film to be measured according to a measurement of the film formed by chemical vapor deposition, or obtaining of a thickness value of a film to be measured by a scanning electron microscope, a more accurate thickness of the insulation layer can be acquired by measuring the fall of the step structure through the motion trajectory of the measuring probe at the time of ascending or descending, according to the embodiments of the present invention. Then, a more accurate dielectric constant of the insulation layer can be calculated according to a capacitance between the first metal layer and the second metal layer and an area of overlap of the first metal layer and the second metal layer.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

What is claimed is:

1. A film structure comprising: a first metal layer, a second metal layer, and an insulation layer located between the first metal layer and the second metal layer, wherein:
   in at least a portion of an edge region of the film structure, the first metal layer extends outwards relative to an edge of the insulation layer by a first predetermined length, and the insulation layer extends outwards relative to an edge of the second metal layer by a second predetermined length, such that a thickness value of the insulation layer is determined by acquiring a fall value of a measuring probe at the time of moving between a surface, adjacent to the second metal layer, of the insulation layer and a surface, adjacent to the insulation layer, of the first metal layer, through a motion trajectory of the measuring probe.

2. The film structure of claim 1, further comprising:
   a first measuring terminal connected with the first metal layer; and
   a second measuring terminal connected with the second metal layer.

3. The film structure of claim 1, wherein:
   the first metal layer, the insulation layer and the second metal layer are formed in a step structure on at least one side.

4. The film structure of claim 1, wherein:
   the first metal layer, the insulation layer and the second metal layer are formed in the step structure, in at least the portion of the edge region of the film structure.

5. The film structure of claim 3, wherein:
   in the step structure, an area of a surface, adjacent to the insulation layer, of the first metal layer is greater than or equal to an area of a surface, adjacent to the second metal layer, of the insulation layer.

6. The film structure of claim 3, wherein:
   the first predetermined length is greater than or equal to the second predetermined length.

7. A method of measuring a dielectric constant of an insulation layer, the method comprising:
   providing a turn structure, the film structure comprising: a first metal layer, a second metal layer, and the insulation layer located between the first metal layer and the second metal layer, wherein in at least a portion of an edge region of the film structure, the first metal layer extends outwards relative to an edge of the insulation layer by a first predetermined length, and the insulation layer extends outwards relative to an edge of the second metal layer by a second predetermined length, and
   determining a thickness value of the insulation layer by acquiring a fall value of a measuring probe at the time of moving between a surface, adjacent to the second metal layer, of the insulation layer and a surface, adjacent to the insulation layer, of the first metal layer, through a motion trajectory of the measuring probe in at least the portion of the edge region of the film structure, thereby calculating the dielectric constant of the insulation layer.

8. The method of claim 7, wherein:
   the film structure further comprises:
   a first measuring terminal connected with the first metal layer; and
   a second measuring terminal connected with the second metal layer, and
   the method further comprises:
   determining a capacitance value between the first metal layer and the second metal layer by loading a first voltage signal to the first measuring terminal by means of a first probe, and loading a second voltage signal to the second measuring terminal by means of a second probe; and
   determining the dielectric constant of the insulation layer according to the determined capacitance value between the first metal layer and the second metal layer, the thickness value of the insulation layer, and an area of overlap of the first metal layer and the second metal layer.

9. The method of claim 7, wherein:
   the first metal layer, the insulation layer and the second metal layer of the film structure are formed in a step structure on at least one side, and the method comprises:
   determining the thickness value of the insulation layer by acquiring the fall value of the measuring probe at the time of moving between the surface, adjacent to the second metal layer, of the insulation layer and the surface, adjacent to the insulation layer, of the first metal layer, through the motion trajectory of the measuring probe on a side of the film structure where the first metal layer, the insulation layer and the second metal layer have the step structure.

10. A display substrate comprising:
a display region and a peripheral region, wherein the peripheral region of the display substrate has at least one measurement region, and in the measurement region, the display substrate comprises: a first metal layer, a second metal layer and an insulation layer located between the first metal layer and the second metal layer, wherein:
in at least a portion of an edge region of the first metal layer, the second metal layer and the insulation layer, the first metal layer extends outwards relative to an edge of the insulation layer by a first predetermined length, and the insulation layer extends outwards relative to an edge of the second metal layer by a second predetermined length, such that a thickness value of the insulation layer is determined by acquiring a fall value of a measuring probe at the time of moving between a surface, adjacent to the second metal layer, of the insulation layer and a surface, adjacent to the insulation layer, of the first metal layer, through a motion trajectory of the measuring probe.

11. The display substrate of claim 10, wherein:
in the display region of the display substrate, the display substrate comprises: a common electrode layer, a pixel electrode layer, and a source and drain electrode layer, and
the first metal layer is located in a same layer as the common electrode layer, and the second metal layer is located in a same layer as the pixel electrode layer or the source and drain electrode layer.

12. The display substrate of claim 10, wherein:
in the measurement region, the display substrate further comprises:
a first measuring terminal connected with the first metal layer; and
a second measuring terminal connected with the second metal layer.

13. The display substrate of claim 10, wherein:
the first metal layer, the insulation layer and the second metal layer are formed in a step structure on at least one side.

14. The display substrate of claim 12, wherein:
the first measuring terminal is located in a same layer as the first metal layer, and the second measuring terminal is located in a same layer as the second metal layer.

15. The display substrate of claim 10, wherein:
the first metal layer and the second metal layer correspond to two metal layers located in different layers in the display region, respectively, and are located in same layers as the two corresponding metal layers, respectively, and the insulation layer is located in a same layer as an insulation layer between the two metal layers located in different layers.

16. A method of measuring a dielectric constant of an insulation layer, the method comprising:
providing a display suberate, the display suberate comprising: a display region and a peripheral region, wherein the peripheral region of the display substrate has a least one measurement region, and in the measurement region, the display substrate comprises: a first metal layer, a second metal layer and the insulation layer located between the first metal layer and the second metal layer, wherein in at least a portion of an edge region of the first metal layer, the second metal layer and the insulation layer, the first metal layer extends outwards relative to an edge of the insulation layer by a first predetermined length, and the insulation layer extends outwards relative to an edge of the second metal layer by a second predetermined length; and
determining a thickness value of the insulation layer by acquiring a fall value of a measuring probe at the time of moving between a surface, adjacent to the second metal layer, of the insulation layer and a surface, adjacent to the insulation layer, of the first metal layer, through a motion trajectory of the measuring probe in at least the portion of the edge region of the first metal layer, the insulation layer and the second metal layer, thereby calculating the dielectric constant of the insulation layer.

17. The method of claim 16, wherein:
in the measurement region, the display substrate further comprises:
a first measuring terminal connected with the first metal layer; and
a second measuring terminal connected with the second metal layer, and
the method further comprises:
determining a capacitance value between the first metal layer and the second metal layer by loading a first voltage signal to the first measuring terminal by means of a first probe, and loading a second voltage signal to the second measuring terminal by means of a second probe; and
determining the dielectric constant of the insulation layer according to the determined capacitance value between the first metal layer and the second metal layer, the thickness of the insulation layer, and an area of overlap of the first metal layer and the second metal layer.

18. The method of claim 16, wherein:
the determining the thickness value of the insulation layer comprises:
measuring, by a measuring probe, a fall of the measuring probe at the time of moving between the surface, adjacent to the second metal layer, of the insulation layer and the surface, adjacent to the insulation layer, of the first metal layer, and recording a motion trajectory of the measuring probe at the time of ascending or descending;
acquiring a fall value between the surface, adjacent to the second metal layer, of the insulation layer and the surface, adjacent to the insulation layer, of the first metal layer according to the recorded motion trajectory of the measuring probe at the time of ascending or descending; and
determining the thickness value of the insulation layer according to the acquired fall value.

19. A method of manufacturing a display substrate,
the display substrate comprising: a display region and a peripheral region, wherein the peripheral region of the display substrate has at least one measurement region, and in the measurement region, the display substrate comprises: a first metal layer, a second metal layer and an insulation layer located between the first metal layer and the second metal layer, wherein in at least a portion of an edge region of the first racial layer, the second metal layer and the insulation layer, the first metal layer extends outwards relative to an edge of the insulation layer by a first predetermined length, and the insulation layer extends outwards relative to an edge of the second metal layer by a second predetermined length, such that a thickness value of the insulation layer is determined by acquiring a fall value of a measuring probe at the time of moving between a surface, adjacent to the second metal layer, of the insulation layer and a surface, adjacent to the insulation layer, of the first metal layer, through a motion trajectory of the measuring probe, the method comprising:

forming patterns of the first metal layer and the first measuring terminal on a substrate by a single patterning process;

forming a pattern of the insulation layer on the substrate formed with the first metal layer; and forming patterns of the second metal layer and the second measuring terminal on the substrate formed with the insulation layer, by a single patterning process.

20. The method of claim 19, wherein: the pattern of the first metal layer and a pattern of the common electrode layer are formed by a single patterning process, and the pattern of the second metal layer and a pattern of the pixel electrode layer or the source and drain electrode layer are formed by a single patterning process.

* * * * *